United States Patent [19]
Becker, Jr. et al.

[11] Patent Number: 5,999,076
[45] Date of Patent: Dec. 7, 1999

[54] MAGNETIC RESONANCE IMAGING PASSIVELY SHIMMED SUPERCONDUCTING MAGNET ASSEMBLY

[75] Inventors: Robert Henry Becker, Jr., Burlingame, Calif.; Gregory F. Hayworth, Florence, S.C.; Kenneth Gordon Herd, Niskayuna, N.Y.; Xianrui Huang, Florence, S.C.; Peter Angus Morgan; Richard Andrew Ranze, both of Scotia, N.Y.; Minfeng Xu, Florence, S.C.

[73] Assignee: General Electric Company, Milwaukee, Wis.

[21] Appl. No.: 09/223,513

[22] Filed: Dec. 30, 1998

[51] Int. Cl.$^6$ ........................................ G01V 3/00
[52] U.S. Cl. ............................ 335/301; 324/320
[58] Field of Search ................... 335/216, 296, 335/298, 301, 306; 324/318, 319, 320

[56] References Cited

U.S. PATENT DOCUMENTS 5,786,695  7/1998  Amor et al. ............................. 324/320

*Primary Examiner*—Lincoln Donovan
*Assistant Examiner*—Raymond Barrera
*Attorney, Agent, or Firm*—Irving M. Freedman; Christian G. Cabou; Phyllis Y. Price

[57] ABSTRACT

A passive shimming system for a superconducting magnet to improve bore magnetic homogeneity includes a plurality of axially extending non-magnetic drawers each including a plurality of pockets along the drawer with a securable cover for each pocket to enclose the selected ferromagnetic shim disks and compressible spring material to enable individual access and shimming of selected pockets.

11 Claims, 2 Drawing Sheets

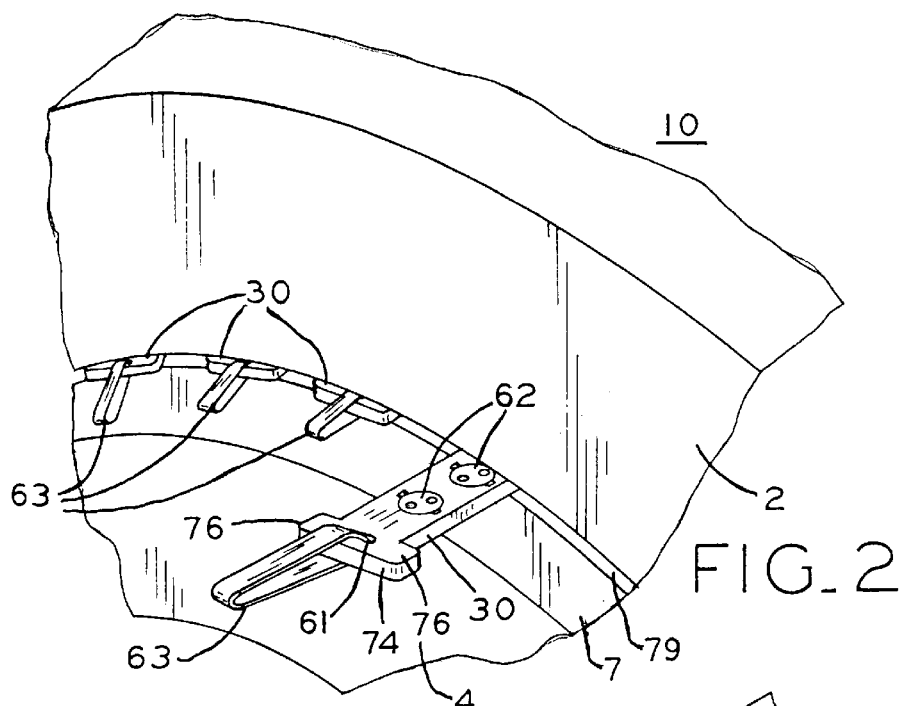
FIG_2
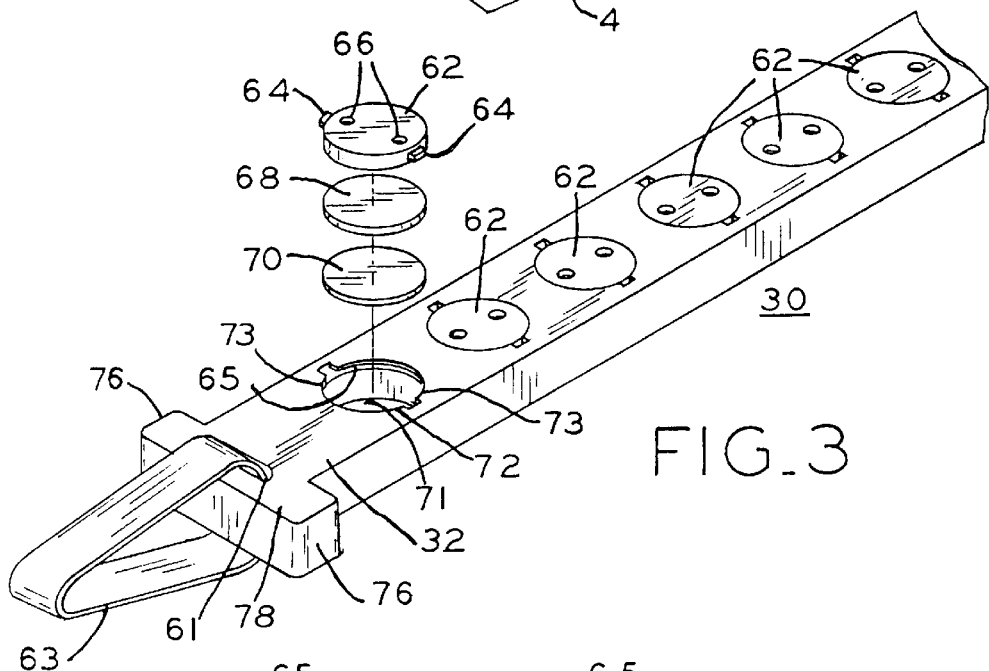
FIG_3
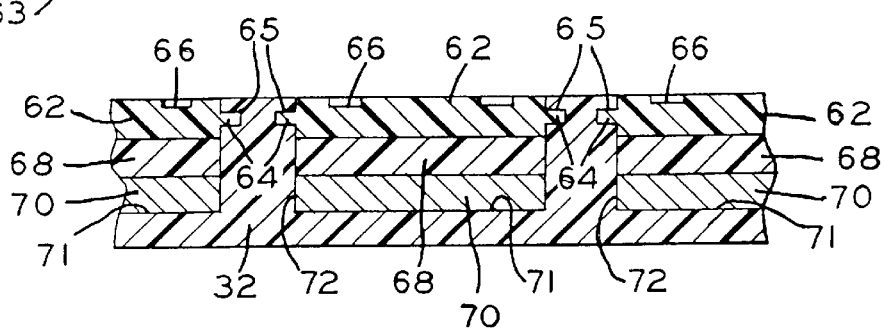
FIG_4

MAGNETIC RESONANCE IMAGING PASSIVELY SHIMMED SUPERCONDUCTING MAGNET ASSEMBLY

BACKGROUND OF INVENTION

This invention relates to a superconducting magnet assembly for a magnetic resonance imaging system (hereinafter called "MRI"), and more particularly to an improved and simplified passive shimming arrangements in such an assembly.

As is well known, a superconducting magnet can be made superconducting by placing it in an extremely cold environment, such as by enclosing it in a cryostat or pressure vessel containing liquid helium or other cryogen. The extreme cold ensures that the magnet coils are superconducting, such that when a power source is initially connected to the coil for a short period of time to introduce a current flow through the coils, the current will continue to flow through the coils even after power is removed due to the absence of resistance, thereby maintaining a strong magnetic field. Superconducting magnets find wide application in the field of MRI.

In order to compensate for the inhomogeneities in MRI magnets, various arrangements including correction coils and passive ferromagnetic shim materials have been used.

Open architecture MRI magnets tend to produce increased field inhomogeneity due to increased coil deformation and coil misalignment. Prior art superconducting magnet designs are directed at minimizing such inhomogeneity during the design stage, and then add passive shim systems to reduce the inhomogeneity that remains after the manufacturing cycle due to manufacturing tolerances and design restrictions.

The shimming frequently utilizes a combination of correction coils and passive ferromagnetic shims with the superconducting magnet adjusted at the factory to provide a homogeneous magnetic field in the imaging bore of the magnet. Since the passive shims are positioned between the warm imaging bore and the gradient coil it is difficult with current designs to access and adjust or change the passive shims after the gradient coil is installed and while minimizing the profile or space occupied by the shim assembly. However, due to magnetic material in the vicinity of the magnet at the installation site, it is frequently necessary to reshim the magnet to provide the required field homogeneity.

Because of the difficulty in adjusting the configuration of the passive shims, the on-site adjustment has frequently been to vary the current through the correction coils. Since the correction coils associated circuitry and leads are extremely expensive a magnet which minimizes or eliminates the need for such a correction coil assembly is highly desirable.

Accordingly, it is highly desirable to be able to do the rough shimming at the on-site and the fine shimming at the installation site without disturbing the gradient coils while providing the ability to readily access particular shim members without disturbing other shim members.

SUMMARY OF INVENTION

Thus, there is a particular need for an improved passive shim system which avoids the aforementioned problems yet which effectively corrects magnetic field inhomogeneities at the installation site.

In accordance with one form of the subject invention, passive shimming is provided in a superconducting magnet through the use of a plurality of low profile rails spaced around the magnet bore axis between the gradient coil and magnet. Each rail is slidably mounted and includes a plurality of circular pockets along the length in which selected ferromagnetic disks of desired thickness along with a spring are secured in place by a detachable cover with a tab and slot securing mechanism.

The individual covers enable selective access and reshimming of a particular shim pocket without disturbing other shim pockets and shims. A flexible non-magnetic strip at the end of a rail facilitates grasping and removing a selected rail contributing to the low profile shim assembly, facilitating a superconducting magnet without correction coils.

DESCRIPTION OF DRAWINGS AND INVENTION

FIG. 2 is an enlarged portion of FIG. 1 showing the location and details of the passive shims assembly.

FIG. 3 shows the details of the shim rails of FIG. 2.

FIG. 4 is an enlarged cross section of a portion of FIG. 3.

Figure 1:
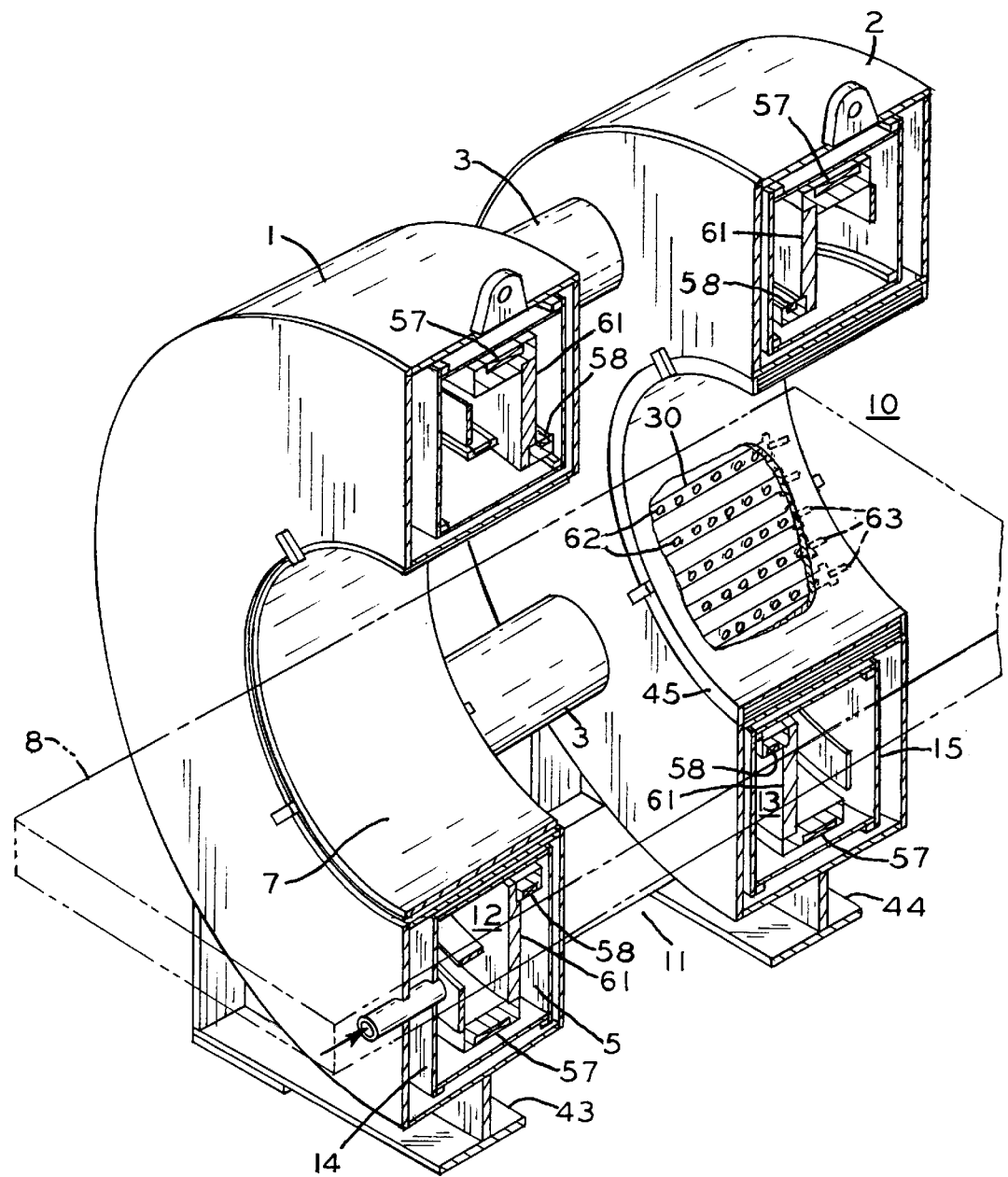
FIG. 1 is a cross section of an MRI superconducting magnet shown in simplified form and including the present invention.

Referring first to FIG. 1, superconducting magnet assembly 10 includes a pair of torroidal-shaped vacuum vessels or housings 1 and 2 separated by three or four axially extending stainless steel spacers 3 positioned around the axis of central bore 7 of superconducting magnet assembly 10. It is to be noted that the overall structure formed by vacuum vessels 1 and 2 and spacer posts 3 provides substantial openings or open space 11 between vacuum vessels 1 and 2 which avoids enclosure of the patient positioned on the patient support shown generally by dashed member 8. The use of three spacers 3 could be used, leaving more than 90 degrees of open space for use and access by a medical practitioner, such as a surgeon, to a patient being imaged by the MRI equipment.

Annular cylinders 14 and 15 of rectangular cross section are thermal radiation shields between superconducting magnet coil assemblies 12 and 13, respectively, and vacuum vessels I and 2, respectively. Each superconducting magnet assembly 12 and 13 includes main magnet coils 57 wound in cavities or annular grooves with rectangular cross section within magnet coil form 61.

Magnet coils 57 are cooled to superconducting temperatures in the order of four degrees Kelvin (4 K) by cooling means (not shown). Power to energize magnet coils 57 is supplied by way of suitable electrical connections (not shown).

Referring next to FIGS. 1, 2, 3 and 4, slidably inserted around the periphery of gradient coil 7 intermediate the gradient coil and housing 2 are a plurality of passive shim assemblies 30 fabricated of non-magnetic material such as Textolite, phenolic or molded plastic slidably inserted into rail assembly or mounting drum 79. Each drawer 32 includes a plurality of generally circular pockets 72 extending along the length thereof and substantially covering the drawer. Pockets 72 do not extend completely through drawer 32 providing a bottom surface 71 for each pocket. Positioned within pockets 72 are one or more magnetic members or disks 70 of various thicknesses which are selected to provide the desired shimming effects on the magnetic field in imaging bore 4.

In the manner described in more detail below, spring material 68 which may be polystyrene foam is interposed between magnetic disk 70 and cover 62. Cover 62 is substantially circular with a pair of radial extensions 64 which are shaped to enable the radial extensions to pass through and engage slots or grooves 65 (see FIG. 4) in drawer 32 such that the radial extensions retain the cover in place when the cover is rotated until the radial extensions engage the slots. Indentations such as indentation 66 are provided on the outside of cover 62 to enable the use of a spanner wrench to facilitate the rotation and securing of the covers.

The outer ends 78 of drawers 32 include ears or extensions 76 which act as positioning stops within non-magnetic rail assembly 79 within which the drawers are slidably mounted. A flexible non-magnetic strap 63 of polypropylene material extends through slot 61 in end 78 of drawer 32 to enable the flexible strap to be grasped and the drawer to be selectively withdrawn from rail assembly 33 of superconducting magnet assembly 10 for the individual opening and placement, or changing, of magnetic disks 70 within an individual pocket 72 without disturbing the magnetic members within the remainder of pockets 72 in a particular drawer. Thus, each cover 62 can be removed individually, allowing each pocket 72 to be re-shimmed while other pockets are protected from accidentally being changed or disturbed with the remainder of magnetic disk members 70 securely retained upon rail 30. The ability to uncover and access a selected pocket 72 of drawer 32 to provide selective access to individual shim members without uncovering other shim members also decreases the likelihood of misshimming.

Thin flexible strap 63 is twisted into empty space adjacent rail assembly 79 when shim assemblies 30 are positioned in superconducting magnet 10 but may be readily unfolded to allow a service engineer to pull out a selected drawer 32. This avoids the need to grasp a drawer 32 by hand, enabling the gap between the magnet and gradient coil to be decreased to an amount just sufficient to allow enough space for the drawers and rail assembly 79. The present design thus enables a low profile shim assembly of as little as ¼ inch spacing between housing 2 and gradient coil 7. Moreover, for most installations the ability to readily access individual shim members 70 enables a magnet design in which correction coils 58 may be omitted providing considerable cost savings.

By way of example, drawers 32 may be 57–72 inches long, 1.5 inches wide and 0.15–0.25 inches deep while magnetic disks 70 vary in thickness of 0.001 to 0.10 inches. Drawers 32 are of non-magnetic material such as Textolite, phondic or polyurethane, and spring material 68 is polystyrene. There are 32–48 shim assemblies 30 in a typical application of the invention.

While superconducting magnet assembly 10 may be, and is, tested and adjusted for field homogeneity during factory testing and operation, it is necessary to further adjust the magnetic field for the particular installation area such as a hospital MRI imaging room. The MRI imaging room may be in relatively close proximity to other electronic devices which can be disturbed by the stray field of the MRI superconducting magnet 10. In addition, since the stray magnetic field of MRI magnet 10 greater than 5 gauss must by regulation be restricted from contacting the general public, magnetic shielding is frequently added to the imaging room. The added shielding can disturb or perturb the homogeneity of the MRI magnetic field necessitating adjustment at the installation. This can be readily accomplished by selectively removing one or more magnetic shim assemblies 30 to reposition, replace or add selected thickness magnetic shim members or disks 70 to selected pockets 72 by opening their covers 62 in order to tailor and obtain the desired magnetic field pattern and homogeneity in the critical imaging region of central bore 7. This can, and as a practical matter, must be accomplished during superconducting operation of the magnetic resonance imaging system. The present invention readily accommodates such final field homogeneity adjustments after installation of superconducting MRI magnet assembly 10, or as may be subsequently required because of changes in and around the imaging room, providing increased shimming accuracy and reducing shimming time.

While the present invention has been described with respect to certain preferred embodiments thereof, it is to be understood that numerous variations in the details of construction, the arrangement and combination of parts, and the types of materials used may be made without departing from the spirit and scope of the invention.

What is claimed is:

1. In a magnetic resonance imager superconducting magnet including magnet coils in a cryogen vessel surrounding an imaging bore extending along the axis of said superconducting magnet, passive shim apparatus for improving the homogeneity of the magnetic field produced in said imaging bore by said magnet coils comprising:

a plurality of removable drawers external to said cryogen vessel and extending axially about said bore;

each of said drawers including a plurality of pockets extending along the length thereof and adapted to receive selected circular magnetic members therein;

and covers for each of said pockets to overlay and secure said selected magnetic members within said pockets;

wherein said pockets and associated covers enable the selective removal of the cover of one or more selected pockets during superconducting operation of said magnet for changing said selected magnetic members without affecting the magnetic members in other of said pockets;

said magnetic members being selectable to improve the magnetic homogeneity in said imaging bore;

wherein said pockets include a circular central portion with a slot around at least a portion of the periphery thereof, and said covers include a circular central portion with at least one radial extension which is rotatable within said slot to selectively secure said covers in place after insertion of selected magnetic members in said pockets.

2. The magnetic shim apparatus of claim 1 wherein there are a plurality of said radial extensions and said drawers include openings adjacent said pockets to enable the insertion of said radial extensions into said slot for rotation and securing of said covers.

3. The magnetic shim apparatus of claim 2 wherein said covers include at least one indentation on the side remote from said magnetic shims enabling the use of a mating tool to assist in the rotation of said covers to unlock said cover and enable its independent removal and reapplication.

4. The magnetic shim apparatus of claim 1 wherein said slot includes a radially extending opening for insertion of said radial extension of said covers and an adjacent circular slot within which said cover is rotatable and selectively securable.

5. The magnetic shim apparatus of claim 1 wherein a compressible member polystrene foam is positioned in said pockets intermediate said covers and said magnetic members to preclude movement of said magnetic members in said pockets.

6. The magnetic shim apparatus of claim 5 wherein said magnetic members are cylindrical disks of magnetic material.

7. The magnetic shim apparatus of claim 1 wherein a non-magnetic rail assembly is positioned intermediate said cryostat and said imaging bore and includes a plurality of rail slots to detachably and slidably secure said drawers within said rail slots.

8. The magnetic shim apparatus of claim 7 wherein said drawers are slidably mounted on a non-magnetic mounting drum positioned exterior to said cryostat contiguous to said imaging bore.

9. The magnetic shim apparatus of claim 8 wherein said superconducting magnet includes a gradient coil adjacent said imaging bore and said drum is positioned intermediate said gradient coil and said cryostat.

10. The magnetic shim apparatus of claim 9 wherein non-magnetic flexible strap is secured to the outer end of said drawers to facilitate their extraction from said drum.

11. The magnetic shim apparatus of claim 10 wherein said drawers are distributed around the periphery of said gradient coil.

* * * * *